US011689201B2

(12) United States Patent
Dhanasekaran et al.

(10) Patent No.: US 11,689,201 B2
(45) Date of Patent: Jun. 27, 2023

(54) UNIVERSAL SERIAL BUS (USB) HOST DATA SWITCH WITH INTEGRATED EQUALIZER

(71) Applicant: QUALCOMM Incorporated, San Diego, CA (US)

(72) Inventors: Vijayakumar Dhanasekaran, San Diego, CA (US); Khaled Mahmoud Abdelfattah Aly, Irvine, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/385,699

(22) Filed: Jul. 26, 2021

(65) Prior Publication Data

US 2023/0024172 A1      Jan. 26, 2023

(51) Int. Cl.
| | |
|---|---|
| *G06F 13/40* | (2006.01) |
| *G06F 13/42* | (2006.01) |
| *H03K 17/687* | (2006.01) |
| *H02J 7/00* | (2006.01) |

(52) U.S. Cl.
CPC ....... *H03K 17/6874* (2013.01); *G06F 13/4022* (2013.01); *G06F 13/4282* (2013.01); *G06F 2213/0042* (2013.01); *H02J 7/00032* (2020.01)

(58) Field of Classification Search
CPC ............. H03K 17/6874; G06F 13/4022; G06F 13/4282; H02J 7/00032; G06F 2213/0042
See application file for complete search history.

(56) References Cited

U.S. PATENT DOCUMENTS

| | | | |
|---|---|---|---|
| 6,937,054 B2 | 8/2005 | Hsu et al. | |
| 7,183,832 B1 | 2/2007 | Voo | |
| 7,368,981 B2 | 5/2008 | Miyagi | |
| 7,536,114 B2 | 5/2009 | Gieseler et al. | |
| 7,560,957 B2 | 7/2009 | Chen et al. | |
| 7,697,601 B2 | 4/2010 | Mansuri et al. | |
| 8,200,179 B1 | 6/2012 | Mosinskis et al. | |
| 8,928,362 B2 | 1/2015 | Kimura et al. | |
| 9,520,872 B2 | 12/2016 | Pandita | |

(Continued)

FOREIGN PATENT DOCUMENTS

| | | |
|---|---|---|
| CN | 103684279 A | 3/2014 |
| EP | 2773041 A1 | 9/2014 |

(Continued)

OTHER PUBLICATIONS

International Search Report and Written Opinion- PCT/US2022/036845 - ISA/EPO - Oct. 13, 2022 (2105759WO).

Musah T., et al., "A 4-32 Gb/s Bidirectional Link With 3-Tap FFE/6-Tap DFE and Collaborative CDR in 22 nm CMOS", IEEE Journal of Solid-State Circuits, IEEE Service Center, Piscataway, NJ, USA, XP011564892, Dec. 1, 2014, Vol. 49, No. 12, pp. 3079-3090, ISSN: 0018-9200, DOI: 10.1109/JSSC.2014.2348556 [retrieved on Nov. 20, 2014].

(Continued)

*Primary Examiner* — Henry Tsai
*Assistant Examiner* — Harry Z Wang
(74) *Attorney, Agent, or Firm* — Loza & Loza, LLP

(57) ABSTRACT

An aspect relates to an apparatus including a first pair of switching devices configured to selectively couple an application processor to a Universal Serial Bus (USB) differential data transmission lines; a USB host port connector coupled to the USB differential data transmission lines; a second pair of switching devices configured to selectively couple an audio circuit to the USB differential data transmission lines; and an equalizer including differential terminals coupled to the USB differential data transmission lines, respectively.

21 Claims, 5 Drawing Sheets

(56) References Cited

U.S. PATENT DOCUMENTS

| | | | |
|---|---|---|---|
| 9,692,617 | B2 | 6/2017 | Chung et al. |
| 10,002,101 | B2 | 6/2018 | Wu et al. |
| 10,187,080 | B1* | 1/2019 | Thasari et al. ...... H03M 1/1061 |
| 10,498,523 | B1 | 12/2019 | Wang et al. |
| 10,733,129 | B2 | 8/2020 | Tang et al. |
| 2007/0096820 | A1 | 5/2007 | Koh et al. |
| 2007/0132501 | A1 | 6/2007 | Koch et al. |
| 2011/0191814 | A1* | 8/2011 | Kobayashi ............ G06F 1/266 |
| | | | 725/127 |
| 2012/0056660 | A1 | 3/2012 | Yamada et al. |
| 2012/0188031 | A1* | 7/2012 | Wu et al. ............... H04B 3/145 |
| | | | 333/28 R |
| 2012/0242377 | A1* | 9/2012 | Yeung et al. .......... H03F 3/195 |
| | | | 327/110 |
| 2013/0049806 | A1 | 2/2013 | Koyama |
| 2013/0187717 | A1 | 7/2013 | Murphy et al. |
| 2014/0015476 | A1* | 1/2014 | Kondo ................ H02J 7/0029 |
| | | | 320/107 |
| 2014/0036982 | A1* | 2/2014 | Ali et al. ................ H04B 3/04 |
| | | | 375/229 |
| 2014/0105432 | A1* | 4/2014 | Jing et al. .............. H04R 5/033 |
| | | | 381/309 |
| 2014/0247089 | A1 | 9/2014 | Van et al. |
| 2014/0247720 | A1 | 9/2014 | Spehar et al. |
| 2014/0266379 | A1 | 9/2014 | Inoue et al. |
| 2015/0363350 | A1* | 12/2015 | Yeung et al. ....... G06F 13/4221 |
| | | | 710/106 |
| 2016/0147704 | A1* | 5/2016 | Guillerm et al. .... G06F 13/409 |
| | | | 710/106 |
| 2016/0378704 | A1* | 12/2016 | Adamson et al. .... G06F 13/364 |
| | | | 710/104 |
| 2017/0244426 | A1* | 8/2017 | Ogata ................... G06F 15/17 |
| 2019/0130923 | A1* | 5/2019 | Elliot ................... G10L 19/008 |
| 2020/0125519 | A1* | 4/2020 | Pan et al. ............ G06F 13/4022 |
| 2020/0228115 | A1 | 7/2020 | Hou |
| 2020/0257354 | A1* | 8/2020 | Vining et al. ........ G06F 1/3206 |
| 2020/0287334 | A1* | 9/2020 | Kulkarni et al. ..... G06F 13/4045 |
| 2021/0075650 | A1* | 3/2021 | Rane et al. ........... H04L 7/0058 |
| 2022/0140821 | A1* | 5/2022 | Delshadpour et al. . H04L 25/06 |
| | | | 327/333 |

FOREIGN PATENT DOCUMENTS

| | | |
|---|---|---|
| JP | H05303436 A | 11/1993 |
| KR | 101817258 B1 | 1/2018 |
| WO | 9857422 A1 | 12/1998 |
| WO | 2012082189 A1 | 6/2012 |

OTHER PUBLICATIONS

Razavi B., "Design of Integrated Circuits for Optical Communications," 2nd ed. Chapter 5, Wiley, 2012, pp. 130-184.

Sackinger E., et al., "A 3-GHz, 32-dB CMOS Limiting Amplifier for SONET OC-48 Receivers," ISSCC Dig. Tech. Papers, Feb. 2000, pp. 158-159.

Sonna P., et al., "Broadband Programmable Equalizer and Limiting Amplifier for an XFI Interface in 45nm CMOS", Proceedings of the Argentine School of Micro-Nanoelectronics, Technology and Applications, 2009, IEEE, Piscataway, NJ, USA, XP031930107, Oct. 1, 2009, pp. 77-80, XP031930107, ISBN: 978-1-4244-4835-7.

Wang H., et al., "A 21-Gb/s 87-mW Transceiver with FFE/DFE/Analog Equalizer in 65-nm CMOS Technology," IEEE Journal of Solid-State Circuits, Apr. 2010, Vol.45, no. 4, pp. 909-920.

Chen J., et al., "Electrical Backplane Equalization Using Programmable Analog Zeros and Folded Active Inductors," IEEE Transactions on Microwave Theory and Techniques, Jul. 2007, Vol.55, No.7, pp. 1459-1466.

Razavi B, "The Cross-Coupled Pair-Part III", A Circuit for All Seasons, IEEE Solid-State Circuits Magazine, vol. 7, no. 1, pp. 10-13, Winter 2015, DOI: 10.1109/MSSC.2014.2369332, Date of publication: Feb. 11, 2015.

\* cited by examiner

UNIVERSAL SERIAL BUS (USB) HOST DATA SWITCH WITH INTEGRATED EQUALIZER

FIELD

Aspects of the present disclosure relate generally to data transmission circuits, and in particular, to a Universal Serial Bus (USB) host data switch with integrated equalizer.

BACKGROUND

A mobile handset device is generally a small form factor device among other small form factor devices, such as tablet devices. Due to the small configuration of such devices, using the device space economically is of particular interests. In this regard, it may be desirable to convert an audio path (e.g., to a headset or speakers) on a mobile handset device from a 3.5-millimeter (mm) jack to a Universal Serial Bus (USB) version C (USB-C) port connector, as the USB-C port connector is more versatile (e.g., transmits audio, exchanges USB data, exchanges battery charger data, etc.).

Because of the additional functionality of providing audio over USB-C, the differential transmission data lines DP/DN associated with the host USB-C circuit are loaded with many components, such as switching devices coupling the differential transmission lines DP/DN to audio circuitry, USB application processor (AP), battery charger circuit, electrostatic discharge (ESD) devices, traces, flex connectors, and other circuitry.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus including a first pair of switching devices configured to selectively couple an application processor to Universal Serial Bus (USB) differential data transmission lines; a second pair of switching devices configured to selectively couple an audio circuit to the USB differential data transmission lines; and an equalizer including differential terminals coupled to the USB differential data transmission lines, respectively.

Another aspect of the disclosure relates to a method. The method includes receiving a Universal Serial Bus (USB) differential data signal to USB differential data transmission lines; equalizing the USB differential data signal; and routing the equalized USB differential data signal between an application processor and a USB host device.

Another aspect of the disclosure relates to an apparatus. The apparatus includes means for receiving a Universal Serial Bus (USB) differential data signal to USB differential data transmission lines; means for equalizing the USB differential data signal; and means for routing the equalized USB differential data signal between an application processor and a USB host connector.

Another aspect of the disclosure relates to a wireless communication device. The wireless communication device includes at least one antenna; a transceiver coupled to the at least one antenna; one or more signal processing cores coupled to the transceiver; and a Universal Serial Bus (USB) data switch coupled to the one or more signal processing cores. The USB data switch includes a first pair of switching devices configured to selectively couple an application processor to USB differential data transmission lines; a second pair of switching devices configured to selectively couple an audio circuit to the USB differential data transmission lines; and an equalizer including differential terminals coupled to the USB differential data transmission lines, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
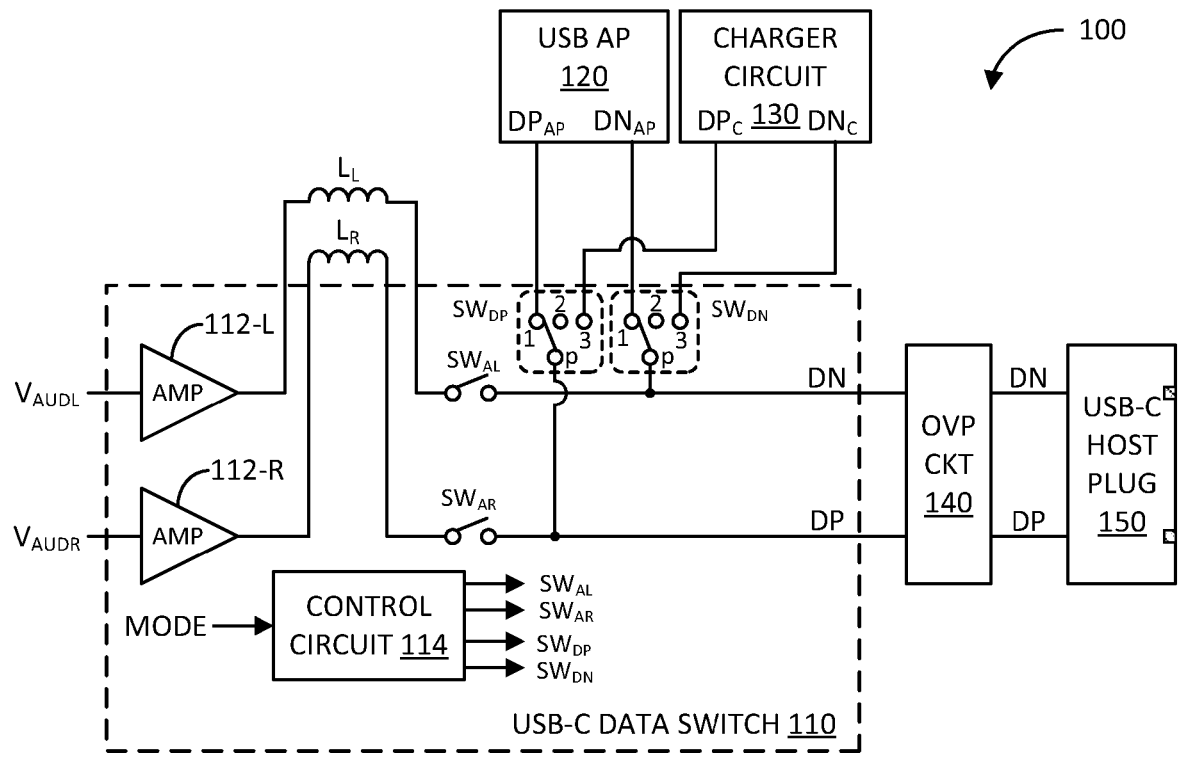
FIG. 1 illustrates a schematic/block diagram of an example Universal Serial Bus (USB) host data communication circuit in accordance with an aspect of the disclosure.

FIG. 1 illustrates a schematic/block diagram of an example Universal Serial Bus (USB) host data communication circuit 100 in accordance with an aspect of the disclosure. The USB host data communication circuit 100 may be integrated into any type of host electronic device, such as a mobile handset device, tablet device, laptop computer, desktop computer, wearable device (e.g., a smart watch, health monitoring device, human activity monitoring device, etc.), Internet of Things (IoT) device, etc.

The USB host data communication circuit 100 is referred to as a "host" because it is capable of providing audio to a client device (e.g., a headset, speakers, etc.), and exchanging USB and battery charger data with a client device (e.g., a USB client device, battery charger, etc.). A USB version C (USB-C) compliant circuit serves to exemplify the concepts described herein, but it shall be understood that other versions of USB or other types of data transmission protocols may employ the concepts described herein.

The USB host data communication circuit 100 includes a USB-C data switch 110, a USB application processor (AP) 120, a charger circuit 130, an overvoltage protection (OVP) circuit 140, and a USB-C host connector (plug) 150. The USB-C switch 110 operates as a multiplexer/demultiplexer to distribute different types of data (e.g., audio, USB, battery charger) to and from USB differential transmission lines DP/DN. The USB-C data switch 110 may include at least a portion of an audio circuit, such as a stereo pair of audio amplifiers 112-L (left (L) channel) and 112-R (right (R) channel) coupled in series with associated off-board inductors $L_L$ and $L_R$, and a pair of switching devices $SW_{AL}$ and $SW_{AR}$, respectively. The USB-C data switch 110 further includes USB differential data transmission lines DN/DP coupled to the pair of switching devices $SW_{AL}$ and $SW_{AR}$, respectively.

The USB-C data switch 110 further includes a pair of switching devices $SW_{DP}$ and $SW_{DN}$ coupled to the USB differential data transmission lines DP/DN, respectively. In one example, the switching devices $SW_{DP}$ and $SW_{DN}$ may each be implemented as single-pole-triple-throw (SPTT) switches, where the poles (labeled as "p") of the switching devices $SW_{DP}$ and $SW_{DN}$ are coupled to the USB differential data transmission lines DP/DN, respectively. The switching devices $SW_{DP}$ and $SW_{DN}$ may also include first throws (labeled as "1") coupled to differential data ports $DP_{AP}/DN_{AP}$ of the USB application processor 120, respectively. The switching devices $SW_{DP}$ and $SW_{DN}$ may also include second throws (labeled as "2"), which may be floating to configure the switching devices in open states. Additionally, the switching devices $SW_{DP}$ and $SW_{DN}$ may include third throws (labeled as "3") coupled to differential data ports DPc and DNc of the charger circuit 130, respectively.

Alternatively, it shall be understood that separate switching devices may electrically couple the $DP_{AP}/DN_{AP}$ and DPc and DNc data ports of the USB application processor 120 and the charger circuit 130 to the USB differential data transmission lines DP/DN, respectively. The USB-C data switch 110 may further include a control circuit 114 configured to control the states of the switching devices $SW_{AL}$, $SW_{AR}$, $SW_{DP}$ and $SW_{DN}$ based on a mode signal, as described in more detail further herein. The USB differential data transmission lines DP/DN of the USB-C data switch 110 is coupled to the (offboard) overvoltage protection (OVP) circuit 140, which, in turn, is differentially coupled to electrical contacts of the USB-C host connector (plug) 150.

In operation, if the mode signal indicates USB data communication mode, the control circuit 114 configures the switching devices $SW_{DP}$ and $SW_{DN}$ to electrically couple the first throws "1" to the poles "p", and configures the switching devices $SW_{AL}$ and $SW_{AR}$ in open states. In this configuration, a USB differential data signal may be communicated between the differential data ports $DP_{AP}/DP_{AN}$ of the USB application processor 120 and the USB differential transmission lines DP/DN for communication with a client device connected to the USB-C host connector 150. Also, in this configuration, the charger circuit 130 is electrically isolated from the USB differential data transmission lines DP/DN. Similarly, the switching devices $SW_{AL}$ and $SW_{AR}$ in open states electrically isolates the audio circuitry from the USB differential data transmission lines DP/DN.

If the mode signal indicates audio transmission mode, the control circuit 114 configures the switching devices $SW_{DP}$ and $SW_{DN}$ to electrically couple the second throws "2" to the poles "p", and configures the switching devices $SW_{AL}$ and $SW_{AR}$ in closed states. In this configuration, stereo audio signals generated by the stereo audio amplifiers 112-R and 112-L are applied to the USB differential transmission lines DP/DN via the inductors $L_R$ and $L_L$ and switching devices $SW_{AL}$ and $SW_{AR}$ for transmission to a client device connected to the USB-C host connector 150. Also, in this configuration, the USB application processor 120 and the charger circuit 130 are electrically isolated from the USB differential data transmission lines DP/DN.

If the mode signal indicates charger data communication mode, the control circuit 114 configures the switching devices $SW_{DP}$ and $SW_{DN}$ to electrically couple the third throws "3" to the poles "p", and configures the switching devices $SW_{AL}$ and $SW_{AR}$ in open states. In this configuration, battery charger data may be communicated between the charger circuit 130 and the USB differential transmission lines DP/DN for communication with a client device connected to the USB-C host connector 150. Also, in this configuration, the USB application processor 120 and the audio circuit (amplifiers 112-L/R and inductors $L_L/L_R$) are electrically isolated from the USB differential data transmission lines DP/DN.

Due to the communication of audio and charger data, in addition to the USB differential data signal, there is a significant number of components coupled to the USB differential data transmission lines DP/DN. For example, the audio switching devices $SW_{AL}$ and $SW_{AR}$ are coupled to the USB differential data transmission lines DN/DP, which introduces significant parasitic capacitance to the transmission lines DN/DP due to their relatively large size to provide audio signal linearity. Additionally, the switching devices $SW_{DP}$ and $SW_{DN}$ including electrostatic discharge (ESD) devices (not shown) coupled to those switching devices $SW_{DP}$ and $SW_{DN}$ further provide significant parasitic capacitance to the transmission lines DP/DN. Also, there are flex connectors and traces that route the signals between the USB-C data switch 110 and the USB-C host connector 150 that further adds significant parasitic capacitance to the transmission lines DP/DN.

Figure 2A:
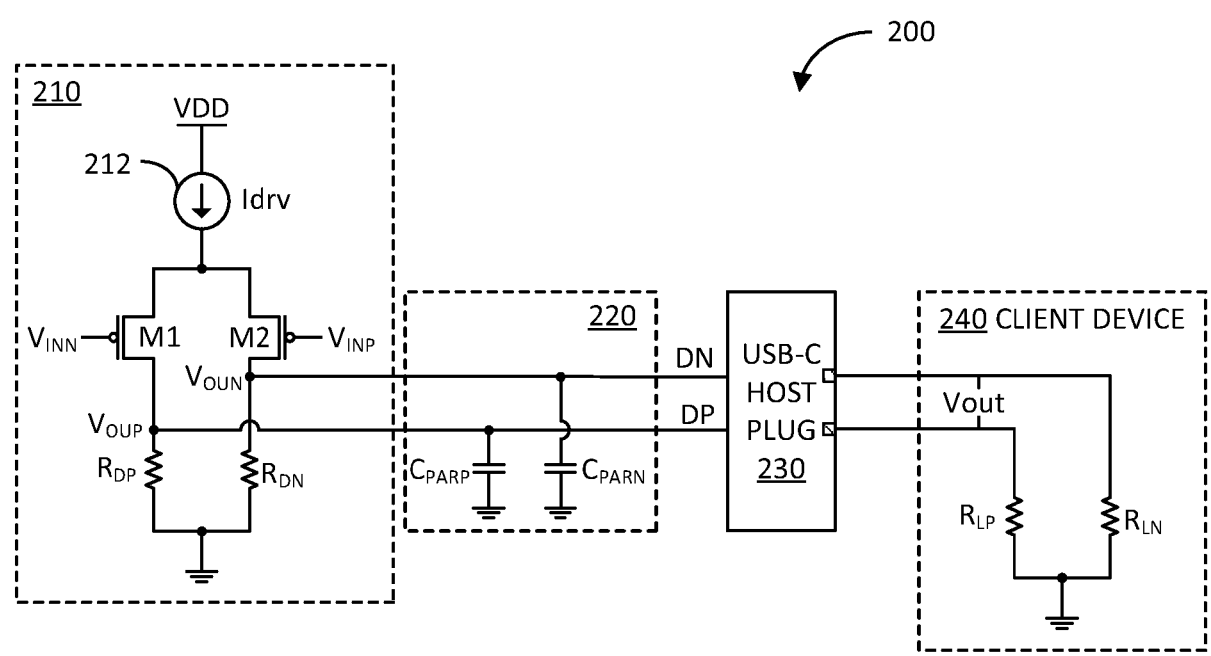
FIG. 2A illustrates a schematic diagram of an example Universal Serial Bus (USB) data transmission system in accordance with another aspect of the disclosure.

FIG. 2A illustrates a schematic diagram of an example Universal Serial Bus (USB) data transmission system 200 in accordance with another aspect of the disclosure. The USB data transmission system 200 may represent a simplified model for the transmission of USB differential data from a USB application processor of a host device to a client device connected to a USB-C host port connector.

In particular, the USB data transmission system 200 includes a USB differential data signal driver 210, a USB-C data switch circuit 220 representing parasitic capacitance as discussed above, a USB-C host connector (plug) 230, and a client device 240 connected to the USB-C host connector 230.

The USB differential data signal driver 210 includes a current source 212, a first field effect transistor (FET) M1 (e.g., a p-channel metal oxide semiconductor (PMOS) FET), and a driver load resistor $R_{DP}$ coupled in series between an upper voltage rail VDD and a lower voltage rail (e.g., ground). The USB differential data signal driver 210 further includes a second FET M2 (e.g., a PMOS FET) coupled in series with the current source 212 and a second driver load resistor $R_{DN}$ between the upper voltage rail VDD and the lower voltage rail (e.g., ground). The first and second FETs M1 and M2 are configured to receive an input USB differential data signal $V_{INN}/V_{INP}$, which may be generated internally within a USB application processor. The USB differential data signal driver 210 is configured to generate an output USB differential data signal $V_{OUP}/V_{OUN}$ at the drains of the first and second FETs M1 and M2, respectively. The drains of the first and second FETs M1 and M2 may serve as the differential data ports of a USB application processor.

The drains of FETs M1 and M2 (e.g., the differential output of the USB differential data signal driver) are coupled to USB differential transmission lines DP/DN of a USB host circuit. The USB-C data switch circuit 220, representing the parasitic capacitance of the components coupled to the USB differential transmission lines DP/DN, include shunt parasitic capacitors $C_{PARP}$ and $C_{PARN}$ coupled between the USB differential transmission lines DP/DN and the lower voltage rail (e.g., ground), respectively. The USB differential transmission lines DP/DN is electrically coupled to DP/DN contacts of the USB-C host connector (plug) 230. As discussed, the client device 240, being connected to the USB-C host connector (plug) 230, is electrically coupled to the DP/DN contacts of the USB-C host connector (plug) 230, as represented by the client load resistors $R_{LP}$ and $R_{LN}$ being coupled between the DP/DN contacts and the lower voltage rail (e.g., ground), respectively.

Figure 2B:
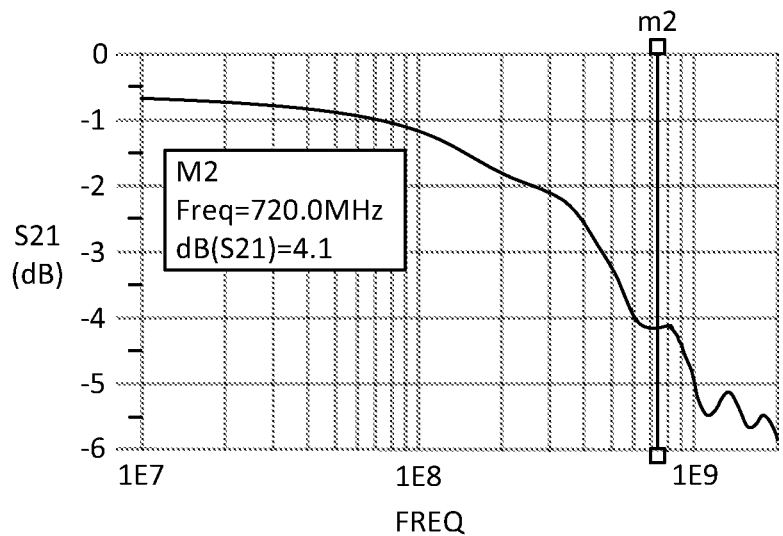
FIG. 2B illustrates a graph of a frequency response associated with data transmission by the USB data transmission system of FIG. 2B in accordance with another aspect of the disclosure.

FIG. 2B illustrates a graph of an insertion loss S21 in decibels (dB) versus frequency associated with the data transmission of the USB data transmission system 200 in accordance with another aspect of the disclosure. The horizontal axis represents frequency extending from 10 mega Hertz (MHz) at the left-end of the graph to two (2) giga Hertz (GHz) at the right-end of the graph. The vertical axis represents insertion loss from 0 dB at the top-end of the graph to -6 dB at the bottom-end of the graph.

As the graph illustrates, the insertion loss S21 below 100 MHz is relatively low, e.g., being about 1.2 dB or less. However, above 100 MHz, the insertion loss S21 increases significantly, e.g., being about 4.1 dB at 720 MHz. The increase in the insertion loss S21 above 100 MHz is generally caused by parasitic capacitance due to the many components coupled to the USB differential transmission lines DP/DN, as represented by the shunt capacitors $C_{PARP}$ and $C_{PARN}$ of the USB-C data switch circuit 220. The increase in the insertion loss S21 with frequency hinders the rate at which data may be transmitted between the USB host device driver 210 and the client device 240. Thus, there is a need to reduce the insertion loss S21 at higher frequencies (e.g., above 100 MHz) so that higher data rates may be achieved.

A first order estimation of the insertion loss S21 or voltage Vout across the client device 240 may be represented by the following equation:

$$\text{Vout} = \text{Idrv} * (1/(2\text{Gterm} + s\text{Cpar})) \quad \text{Eq. 1}$$

where Idrv is the current generated by the current source 212, Gterm is the average conductance of the driver load resistors $R_{DP}$ and $R_{DN}$, and sCpar is the susceptance associated with the parasitic capacitance or the average capacitance of the capacitors $C_{PARP}$ and $C_{PARN}$. As the parameter "s" increases with frequency, the output voltage Vout across the client device 240 decreases, which is also a measure of the insertion loss S21.

Figure 3:
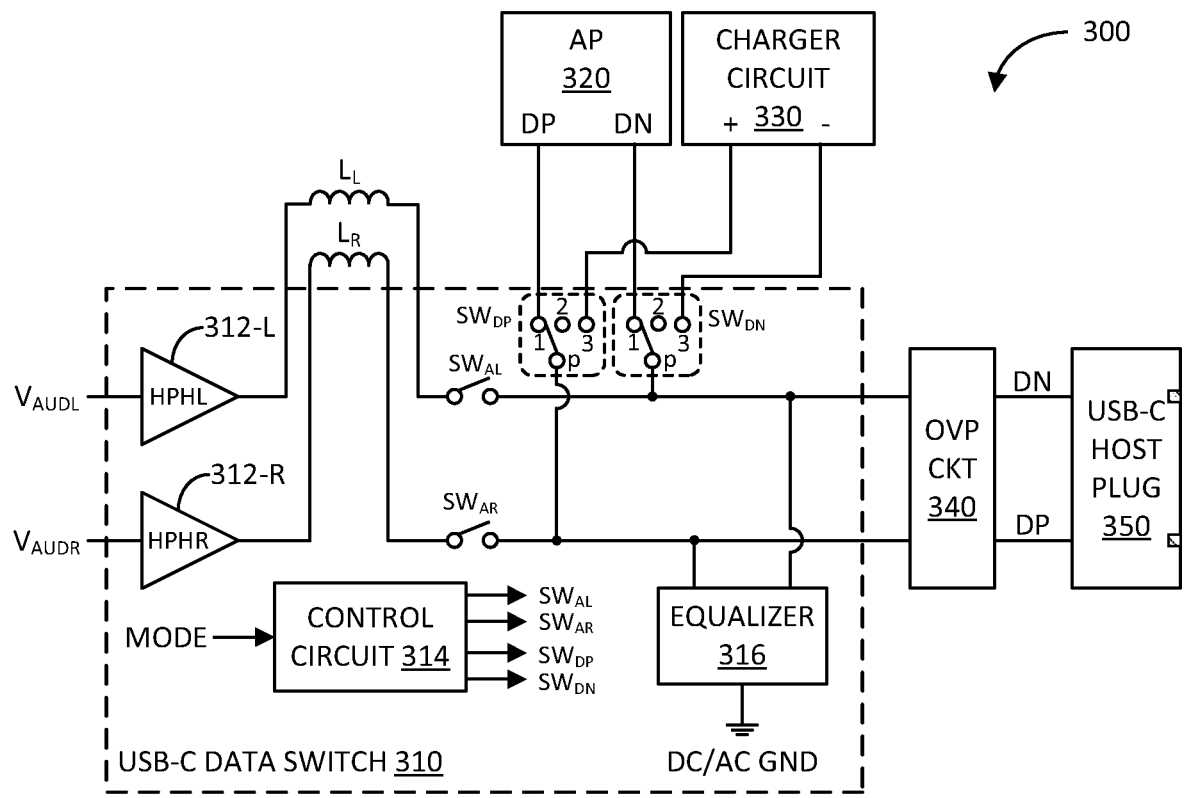
FIG. 3 illustrates a schematic/block diagram of another example Universal Serial Bus (USB) host data communication circuit in accordance with another aspect of the disclosure.

FIG. 3 illustrates a schematic/block diagram of another example Universal Serial Bus (USB) host data communication circuit 300 in accordance with another aspect of the disclosure. The USB host data communication circuit 300 is basically the same as the USB host data communication circuit 100 previously discussed in detail, but includes an equalizer to reduce the insertion loss S21 at higher frequencies (e.g., above 100 MHz), and optionally to reduce the insertion loss at lower frequencies (e.g., below 100 MHz). In essence, the equalizer applies negative capacitance to the USB differential transmission lines DP/DN to substantially cancel out the parasitic capacitance associated with the many components coupled to the transmission lines DP/DN, as previously discussed. Optionally, the equalizer may apply negative conductance to the USB differential transmission lines DP/DN to reduce the conductance in the denominator of equation 1.

As mentioned, the USB host data communication circuit 300 may include the same components as the USB host data communication circuit 100 previously discussed. In USB host data communication circuit 300, the same components or elements are either identified with the same reference labels, and the same reference numbers but with the most significant digit being a "3" instead of a "2". The same components or elements have been previously described in detail with reference to the description of the USB host data communication circuit 100.

In addition, the USB-C data switch 310 further includes an integrated equalizer 316 coupled to the USB differential data transmission lines DP/DN. As discussed, the equalizer 316 is configured to reduce the insertion loss S21 at higher frequencies (e.g., above 100 MHz), and optionally to reduce the insertion loss S21 at lower frequencies (e.g., below 100 MHz). In this regard, the equalizer 316 is configured to apply negative capacitance to the USB differential transmission lines DP/DN to substantially cancel or reduce the parasitic capacitance Cpar associated with the components coupled to the transmission lines DP/DN, as previously discussed. Optionally, the equalizer 316 may be configured to apply negative conductance to the differential transmission lines DP/DN to reduce the conductance Gterm due to the driver load resistors $R_{DP}/R_{DN}$. The equalizer 316 may be regarded as a shunt equalizer coupled between the USB differential data transmission lines DP/DN and DC and/or AC ground.

Figure 4A:
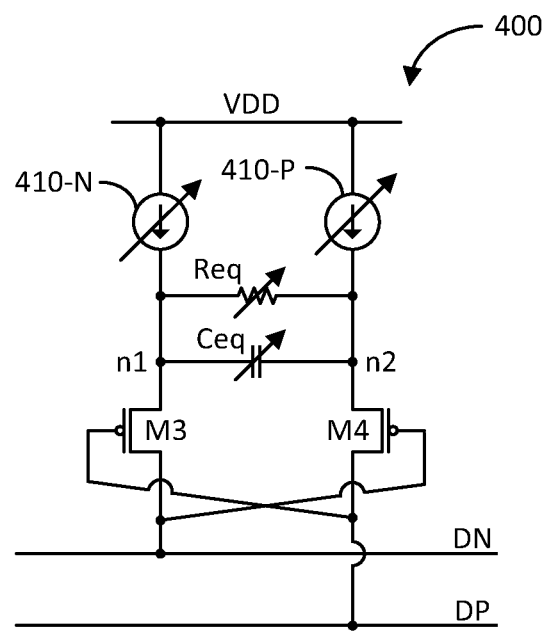
FIG. 4A illustrates a schematic diagram of an example equalizer in accordance with another aspect of the disclosure.

FIG. 4A illustrates a schematic diagram of an example equalizer 400 in accordance with another aspect of the disclosure. The equalizer 400 may be an exemplary detailed implementation of the equalizer 316 of the USB-C data switch 310.

In particular, the equalizer 400 includes a first current source 410-N coupled in series with a first FET M3 (e.g., a PMOS FET) between an upper voltage rail VDD and the negative one (DN) of the USB differential data transmission lines DP/DN. The upper voltage rail VDD may serve as an AC ground. The equalizer 400 further includes a second current source 410-P coupled in series with a second FET M4 (e.g., a PMOS FET) between the upper voltage rail VDD and the positive one (DP) of the USB differential data transmission lines DP/DN. The first FET M3 includes a gate coupled to the positive one (DP) of the USB differential data transmission lines DP/DN. The second FET M4 includes a gate coupled to the negative one (DN) of the USB differential data transmission lines DP/DN.

The equalizer 400 further includes a capacitor Ceq coupled between a first node n1 between the first current source 410-N and the first FET M3, and a second node n2 between the second current source 410-P and the second FET M4. Optionally, the equalizer 400 may include a resistor Req coupled between the first node n1 and the second node n2. So that the negative capacitance and optionally the negative conductance may be configured, including the frequency response (pole(s) and zero(s)) of the equalizer 400, the current sources 410-N and 410-P may be implemented as variable current sources, the capacitor Ceq may be implemented as a variable capacitor, and the optional resistor Req may be implemented as a variable resistor.

A first order estimation of the insertion loss S21 or voltage Vout across the client device 240 with the equalizer 316 or 400 (without the optional resistor Req) may be represented by the following equation:

$$\text{Vout}=\text{Idrv}*(1/(2\text{Gterm}+s\text{Cpar}-s\text{Ceq})) \quad \text{Eq. 2}$$

where Ceq is the capacitance of the capacitor Ceq. Thus, by properly configuring the capacitance Ceq to be substantially equal to the parasitic capacitance Cpar, the expression sCpar-sCeq may be made substantially equal to zero (0); thereby, cancelling the frequency dependency of the insertion loss S21 or output voltage Vout for at least a desired frequency range.

A first order estimation of the insertion loss S21 or voltage Vout across the client device 240 with the equalizer 316 or 400 (including the optional resistor Req) may be represented by the following equation:

$$\text{Vout}=\text{Idrv}*(1/((2\text{Gterm}-\text{Geq})+(s\text{Cpar}-s\text{Ceq}))) \quad \text{Eq. 3}$$

where Geq is the conductance of the resistor Req. Thus, by properly configuring the resistance Req, the expression 2Gterm-Geq may be made smaller to achieve a particular insertion loss S21 at lower frequencies (e.g., below 100 MHz).

Figure 4B:
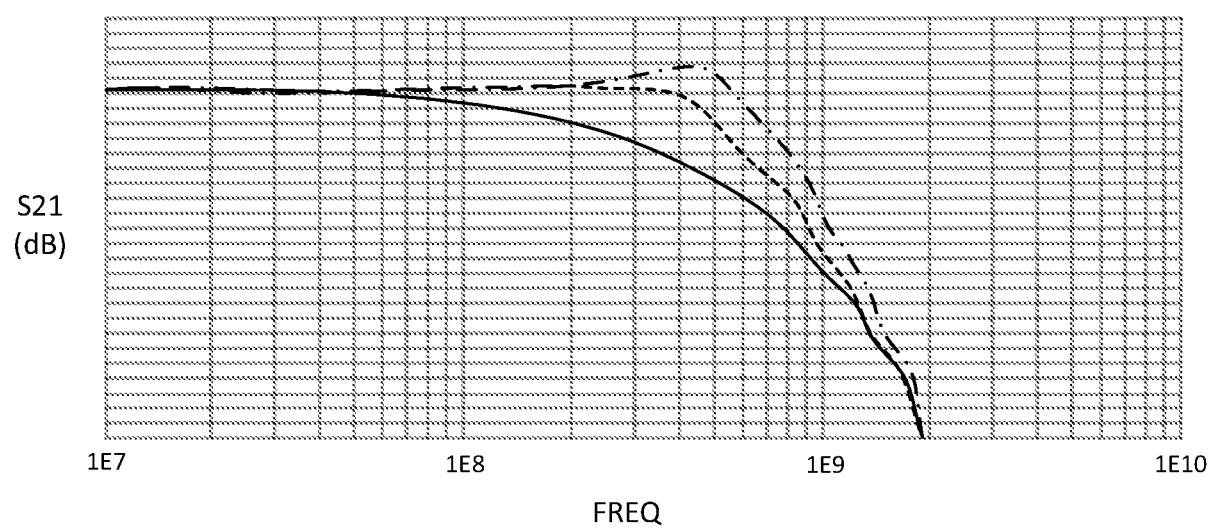
FIG. 4B illustrates a comparison graph of frequency responses associated with a data signal of the USB data communication systems of FIGS. 2A and 3 without and with an equalizer in accordance with another aspect of the disclosure.

FIG. 4B illustrates a comparison graph of frequency responses of data communication of the USB host data communication system 300 with and without the equalizer 316 or 400 in accordance with another aspect of the disclosure. The vertical axis of the graph represents insertion loss S21 between a USB data signal driver and a client device using the USB host data transmission circuit 300 with or without the integrated equalizer 316 or 400. The horizontal axis represents frequency from 10 MHz to 10 GHz. The solid line represents the insertion loss S21 without the equalization provided by the equalizer 316 or 400. The dashed line represents the insertion loss S21 with a less aggressive equalization provided by the integrated equalizer 316 or 400. The dot-dashed line represents the insertion loss S21 with a more aggressive equalization provided by the integrated equalizer 316 or 400.

As the graph illustrates, without equalization provided by the integrated equalizer 316 or 400, the insertion loss S21 rolls off above 100 MHz. With the less aggressive equalization provided by the integrated equalizer 316 or 400, the insertion loss S21 is relatively flat all the way to 400 MHz, and then begins to roll off above that frequency. With the more aggressive equalization provided by the integrated equalizer 316 or 400, the insertion loss S21 is relatively flat to 300 MHz, then decreases to a peak at about 450 MHz, and then begins to roll off above that frequency. Thus, as the insertion loss S21 is significantly reduced at frequencies above 100 MHz with the integrated equalizer 316 or 400, higher data transmission rates between a USB host device and a client device may be achieved.

Figure 5:
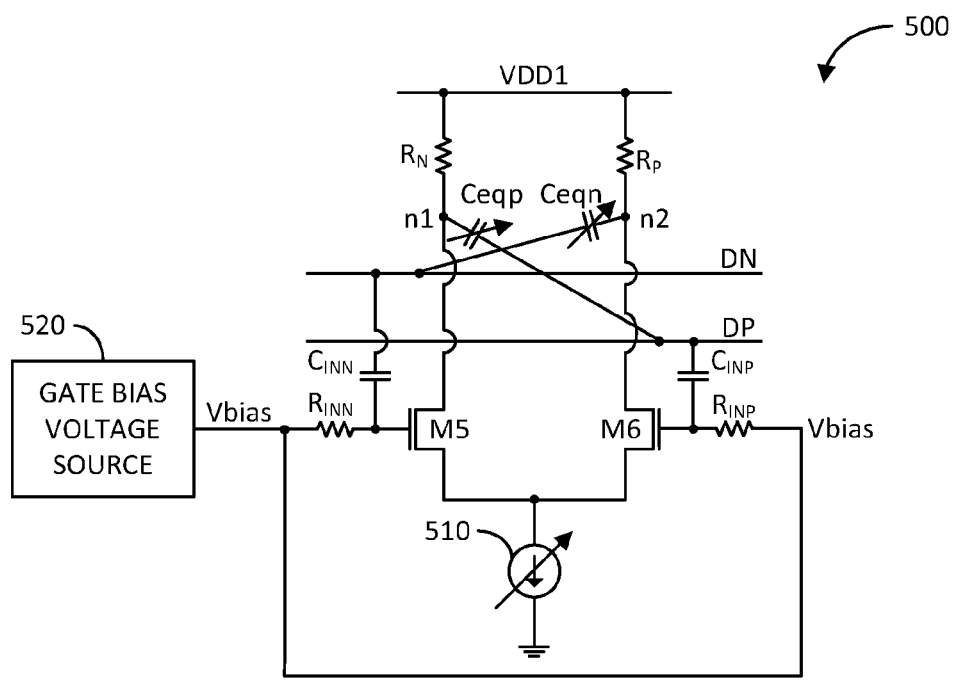
FIG. 5 illustrates a schematic diagram of another example equalizer in accordance with another aspect of the disclosure.

FIG. 5 illustrates a schematic diagram of another example equalizer 500 in accordance with another aspect of the disclosure. The equalizer 500 may be another exemplary detailed implementation of the equalizer 316 of the USB-C data switch 310. In equalizer 400, the FETs M3 and M4 provide direct current (DC) and alternating current (AC) to the USB differential data transmission lines DP/DN. As a result, the equalizer 400 may affect a common mode voltage associated with the USB differential data transmission lines DP/DN. As discussed further herein, the equalizer 500 does not affect the common mode voltage associated with the USB differential data transmission lines DP/DN.

More specifically, the equalizer 500 includes a first resistor $R_N$, a first FET M5 (e.g., an NMOS FET), and a current source 510 coupled in series between an upper voltage rail VDD1 and a lower voltage rail (e.g., ground). The upper voltage rail VDD1 may serve as an AC ground. The equalizer 500 further includes a second resistor $R_p$ and a second FET M6 (e.g., an NMOS FET).

Additionally, the equalizer 500 includes a first capacitor Ceqp coupled between a first node n1 between the first resistor $R_N$ and the first FET M5, and a positive one (DP) of the USB differential data transmission lines DP/DN. The equalizer 500 also includes a second capacitor Ceqn coupled between a second node n2 between the second resistor $R_P$ and the second FET M6, and a negative one (DN) of USB differential data transmission lines DP/DN.

The equalizer 500 further includes a third capacitor $C_{INN}$ coupled between the negative one (DN) of the USB differential data transmission lines DP/DN and a gate of the first FET M5. Further, the equalizer 500 includes a fourth capacitor $C_{INP}$ coupled between the positive one (DP) of the USB differential data transmission lines DP/DN and a gate of the second FET M6.

The equalizer 500 also includes a gate bias voltage source 520 configured to generate a gate bias voltage Vbias. Additionally, the equalizer 500 includes a third resistor $R_{INN}$ coupled between the gate bias voltage source 520 and the gate of the first FET M5. Similarly, the equalizer 500 includes a fourth resistor $R_{INP}$ coupled between the gate bias voltage source 520 and the gate of the second FET M6.

In operation, when the USB data transmission lines DP/DN transition to logic high/low, the logic low signal on the DN line is AC coupled to the gate of FET M5; thereby, turning off FET M5. Thus, a high frequency current path exists between the upper voltage rail VDD1 and the positive one (DP) of the USB differential data transmission lines DP/DN via the resistor $R_N$ and the capacitor Ceqp. Thus, the low voltage on the positive transmission (DP) due to the relatively high insertion loss S21 at high frequencies is boosted by the high frequency current flowing to the positive one (DP) of the USB differential data transmission lines DP/DN.

Similarly, when the USB data transmission lines DP/DN transition to logic low/high, the logic low signal on the DP line is AC coupled to the gate of FET M6; thereby, turning off FET M6. Thus, a high frequency current path exists between the upper voltage rail VDD1 and the negative one (DN) of the USB differential data transmission lines DP/DN via the resistor $R_P$ and the capacitor Ceqn. Thus, the low voltage on the negative transmission (DN) due to the relatively high insertion loss S21 at high frequencies is boosted by the high frequency current flowing applied to the negative one (DN) of the USB differential data transmission lines DP/DN.

As the equalizer 500 is AC (not DC) coupled to the USB differential data transmission lines DP/DN, the equalizer 500 does not affect the common mode voltage associated with the USB differential data transmission lines DP/DN. The capacitors Ceqp and Ceqn may be implemented as variable capacitors, and the current source 510 may also be implemented as a variable current source. This allows the negative capacitance and frequency response (pole(s) and zero(s)) of the equalizer 500 to be set to achieve the desired high frequency insertion loss S21 compensation.

Figure 6:
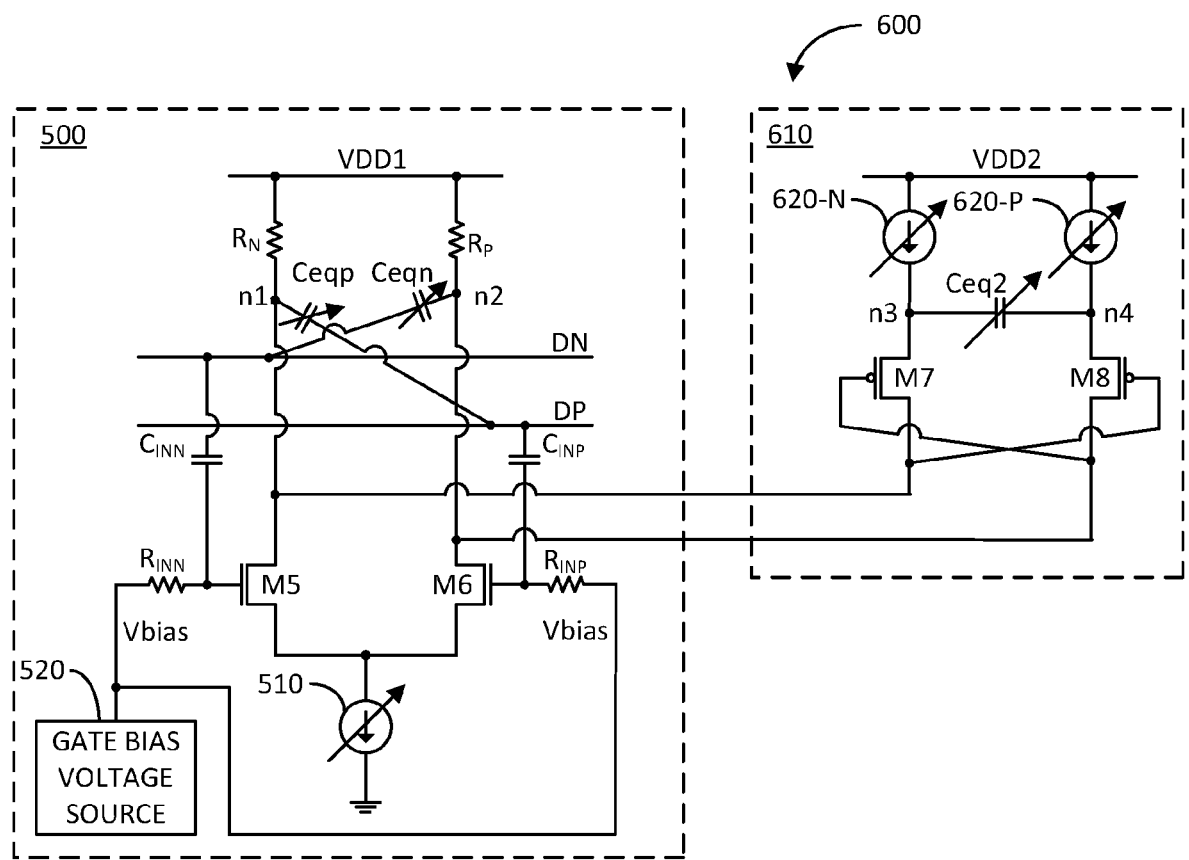
FIG. 6 illustrates a schematic diagram of yet another example equalizer in accordance with another aspect of the disclosure.

FIG. 6 illustrates a schematic diagram of yet another example equalizer 600 in accordance with another aspect of the disclosure. The equalizer 600 includes the equalizer 500 previously discussed, but further includes a negative capacitance equalizer 610 to increase the bandwidth of the equalizer 500. That is, due to internal parasitic capacitance in the equalizer 500, the insertion loss S21 compensation provided by the equalizer 500 may be bandwidth limited. Thus, the negative capacitance equalizer 610 provides negative capacitance to the equalizer 500 to substantially cancel or reduce the internal parasitic capacitance of the equalizer 500. As the equalizer 500 has been discussed in detail above, the following focusses on the description of the negative capacitance equalizer 610.

In particular, the negative capacitance equalizer 610 includes a second current source 620-N coupled in series with a third FET M7 (e.g., a PMOS FET) between an upper voltage rail VDD2 and the first node $n1$ of the equalizer 500. The upper voltage rail VDD2 may be the same as or different than the upper voltage rail VDD1. The upper voltage rail VDD2 may serve as an AC ground. The negative capacitance equalizer 610 further includes a third current source 620-P coupled in series with a fourth FET M8 (e.g., a PMOS FET) between the upper voltage rail VDD2 and the second node $n2$ of the equalizer 500. The third FET M7 includes a third gate coupled to the second node $n2$ of the equalizer 500. The fourth FET M7 includes a fourth gate coupled to the first node $n1$ of the equalizer 500. The negative capacitance equalizer 610 also includes a capacitor Ceq2 coupled between a third node $n3$ between the current source 620-N and the third FET M7, and a fourth node $n4$ between the current source 620-P and the fourth FET M8.

In operation, when the USB data transmission lines DP/DN transition to logic high/low, the logic low signal on the DN line is AC coupled to the gate of FET M7; thereby, turning on FET M7. Thus, a high frequency current path exists between the current source 620-P and the positive one (DP) of the USB differential data transmission lines DP/DN via the capacitor Ceq2 and FET M7. Thus, the low voltage on the positive transmission line (DP) due to the relatively high insertion loss S21 at high frequencies is boosted by the high frequency current flowing to the positive one (DP) of the USB differential data transmission lines DP/DN.

Similarly, when the USB data transmission lines DP/DN transition to logic low/high, the logic low signal on the DP line is AC coupled to the gate of FET M8; thereby, turning on FET M8. Thus, a high frequency current path exists between the current source 620-N and the negative one (DN) of the USB differential data transmission lines DP/DN via the capacitor Ceq2 and FET M8. Thus, the low voltage on the negative transmission (DN) due to the relatively high insertion loss S21 at high frequencies is boosted by the frequency current flowing to the negative one (DN) of the USB differential data transmission lines DP/DN. The capacitor Ceq2 may be implemented as a variable capacitor, and the current sources 620-N and 620-P may also be implemented as variable current sources. This allows the negative capacitance and frequency response (pole(s) and zero(s)) of the negative capacitance equalizer 610 to widen the bandwidth of the equalizer 500 as desired.

Figure 7:
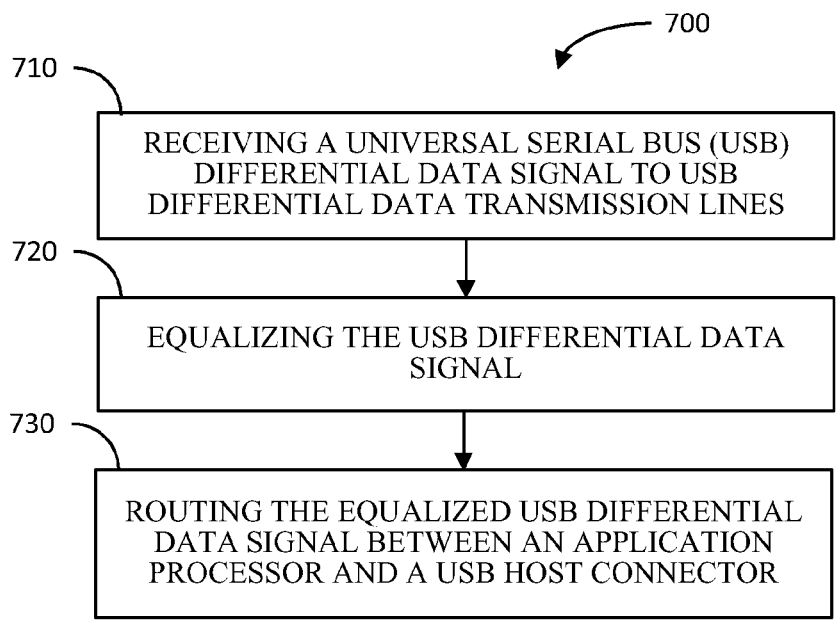
FIG. 7 illustrates a flow diagram of an example method of equalizing Universal Serial Bus (USB) data signal at a host device in accordance with another aspect of the disclosure.

FIG. 7 illustrates a flow diagram of an example method 700 of communicating Universal Serial Bus (USB) data between a host device and a client device in accordance with another aspect of the disclosure. The method 700 includes receiving a Universal Serial Bus (USB) differential data signal to USB differential data transmission lines (block 710). Examples of means for receiving a Universal Serial Bus (USB) differential data signal to USB differential data transmission lines include any of the switching devices SWDP and SWDN or the connection to the OVP circuit 140 and/or USB host connector 150.

The method 700 further includes equalizing the USB differential data signal (block 720). Examples of means for equalizing the USB differential data signal include any of the equalizers described herein. Additionally, the method 700 includes routing the equalized USB differential data signal between an application processor and a USB host connector (block 730). Examples of means for routing the equalized USB differential data signal between an application processor and a USB host connector include the USB differential data transmission lines as described herein.

Figure 8:
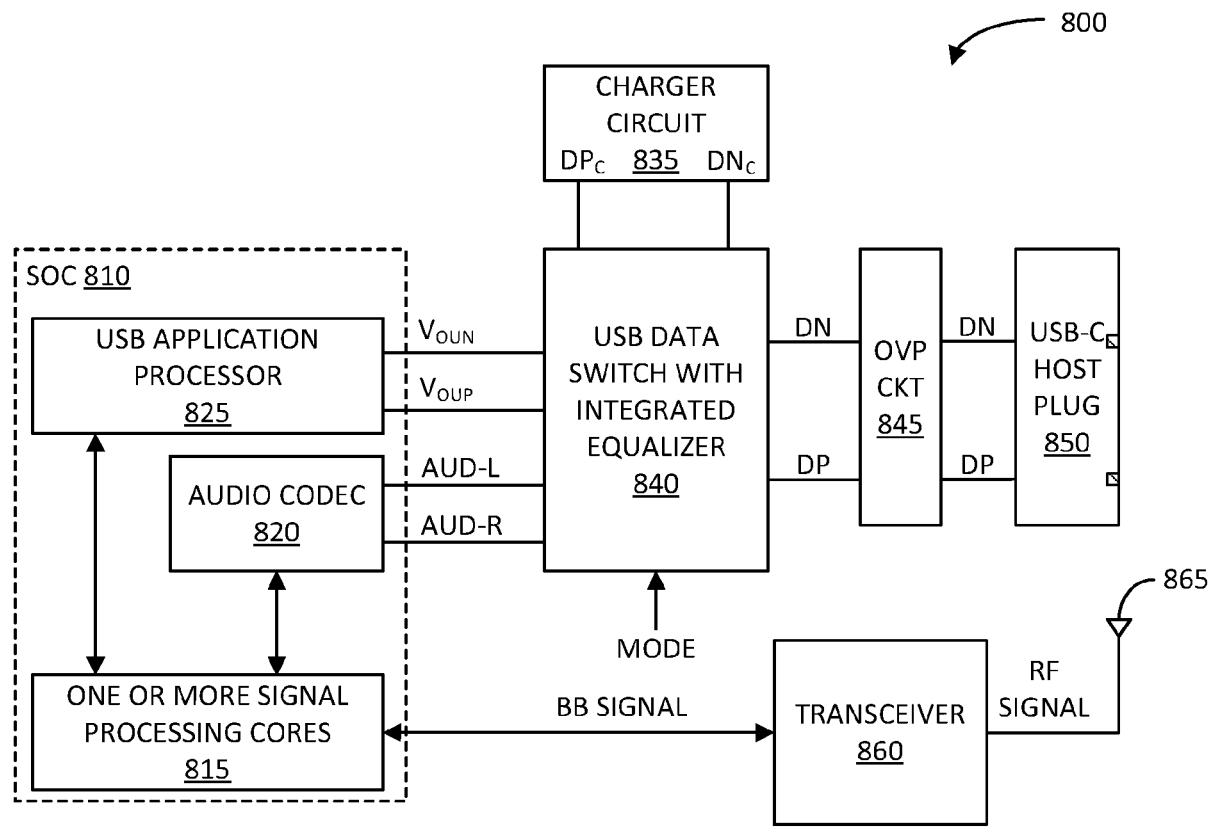
FIG. 8 illustrates a block diagram of an example wireless communication device in accordance with another aspect of the disclosure.

FIG. 8 illustrates a block diagram of an example wireless communication device 800 in accordance with another aspect of the disclosure. The wireless communication device 800 may be implemented as any type of wireless communication device, such as mobile handset device, tablet device, laptop computer, desktop computer, wearable device (e.g., a smart watch, health monitoring device, human activity monitoring device, etc.), Internet of Things (IoT) device, etc.

The wireless communication device 800 includes an integrated circuit (IC) 810, which may be implemented as a system on chip (SOC). The SOC 810 may include one or more signal processing cores 815 coupled to an audio codec 820 and a USB application processor 825. The one or more signal processing cores 815 may be configured to generate and/or process a baseband (BB) signal. The audio codec 820 may be configured to generate stereo analog audio signals AUD-L and AUD-R based on audio data received from the one or more signal processing cores 815. The USB application processor 825 is configured to generate a USB differential data signal $V_{OUN}/V_{OUP}$ based on data received from the one or more signal processing cores 815, and/or process the USB differential data signal $V_{OUN}/V_{OUP}$ received from a client device connected to a USB-C host connector (plug) 850.

The wireless communication device 800 further includes a USB data switch with integrated equalizer 840, which may be implemented as per USB-C data switch 310 including any of the integrated equalizers 316, 400, 500, and 600. The USB-C data switch with integrated equalizer 840 is differentially coupled to the USB application processor 825 to receive and/or provide the USB differential data signal $V_{OUN}/V_{OUP}$ therefrom and/or thereto. The USB-C host data switch with integrated equalizer 840 is coupled to the audio codec 820 to receive the stereo analog audio signals AUD-L and AUD-R. The USB host transmission circuit 840 may be coupled to a charger circuit 835 to receive and/or provide charger data therefrom and/or thereto. The USB-C data switch with integrated equalizer 840 includes at least a portion of the USB differential transmission lines DP/DN, which is coupled to an overvoltage protection (OVP) circuit 845 and electrical contacts of a USB-C host connector (plug) 850.

A client device may be plugged into the USB-C host connector (plug) 850. If a mode signal indicates USB data communication, the USB-C data switch with integrated equalizer 840 may route the USB differential data signal $V_{OUN}/V_{OUP}$, which is equalized by the integrated equalizer, to the client device or the USB application processor 825. If the mode signal indicates stereo audio transmission, the USB-C data switch with integrated equalizer 840 may route the stereo analog audio signals AUD-L and AUD-P to the client device via the USB differential data transmission lines DN/DP, OVP circuit 845, and the USB-C host connector 850. And, if the mode signal indicates charger data communication, the USB host transmission circuit 840 may route the charger data signals to the client device or charger circuit 835.

For wireless transmissions, the wireless communication device 800 includes a transceiver 860 coupled to the one or more signal processing cores 815 to provide and/or receive a baseband (BB) signal to and/or from the one or more signal processing cores 815. The wireless communication device 800 also includes at least one antenna 865 (e.g., an antenna array) to provide and/or receive a radio frequency (RF) signal to and/or from the transceiver 860. In accordance with a transmission application, the transceiver 860 is configured to process a transmit BB signal to generate a transmit RF signal for wireless transmission to a remote device via the at least one antenna 865. In accordance with a receive application, the transceiver 860 is configured to process an RF signal received from the at least one antenna 865 to generate a received BB signal for signal processing by the one or more signal processing cores 815.

The following provides an overview of aspects of the present disclosure:

Aspect 1: An apparatus, including: a first pair of switching devices configured to selectively couple an application processor to Universal Serial Bus (USB) differential data transmission lines; a second pair of switching devices configured to selectively couple an audio circuit to the USB differential data transmission lines; and an equalizer including differential terminals coupled to the USB differential data transmission lines, respectively.

Aspect 2: The apparatus of aspect 1, wherein the equalizer includes: a first current source; a first field effect transistor (FET) coupled in series with the first current source between a first voltage rail and a negative one of the USB differential data transmission lines, wherein the first FET includes a first gate coupled to a positive one of the USB differential data transmission lines; a second current source; a second FET coupled in series with the second current source between the first voltage rail and the positive one of the USB differential data transmission lines, wherein the second FET includes a second gate coupled to the negative one of the USB differential data transmission lines; and a capacitor coupled between a first node between the first current source and the first FET, and a second node between the second current source and the second FET.

Aspect 3: The apparatus of aspect 2, wherein the capacitor includes a variable capacitor.

Aspect 4: The apparatus of aspect 2 or 3, wherein the equalizer further includes a resistor coupled between the first and second nodes.

Aspect 5: The apparatus of aspect 4, wherein the resistor includes a variable resistor.

Aspect 6: The apparatus of any one of aspects 1-5, wherein the first and second current sources include first and second variable current sources, respectively.

Aspect 7: The apparatus of any one of aspects 1-6, wherein the first and second FETs include p-channel metal oxide semiconductor (PMOS) FETs, respectively.

Aspect 8: The apparatus of aspect 1, wherein the equalizer includes: a first resistor; a first field effect transistor (FET); a first current source coupled in series with the first resistor and the first FET between a first voltage rail and a second voltage rail; a second resistor; a second FET coupled in series with the second resistor and the first current source between the first and second voltage rails; a first capacitor coupled between a first node between the first resistor and the first FET, and a positive one of the USB differential data transmission lines; and a second capacitor coupled between a second node between the second resistor and the second FET, and a negative one of the USB differential data transmission lines.

Aspect 9: The apparatus of aspect 8, wherein the equalizer further includes: a third capacitor coupled between the negative one of the USB differential data transmission lines and a first gate of the first FET; and a fourth capacitor coupled between the positive one of the USB differential data transmission lines and a second gate of the second FET.

Aspect 10: The apparatus of aspect 8 or 9, wherein the equalizer further includes: a gate bias voltage source; a third resistor coupled between the gate bias voltage source and a first gate of the first FET; and a fourth resistor coupled between the gate bias voltage source and a second gate of the second FET.

Aspect 11: The apparatus of any one of aspects 8-10, wherein the first and second capacitors include first and second variable capacitors, respectively.

Aspect 12: The apparatus of any one of aspects 8-11, wherein the first current source includes a variable current source.

Aspect 13: The apparatus of any one of aspects 8-12, wherein the first and second FETs include n-channel metal oxide semiconductor (NMOS) FETs, respectively.

Aspect 14: The apparatus of aspect 8, wherein the equalizer further includes: a second current source; a third FET coupled in series with the second current source between the first voltage rail and the first node, wherein the third FET includes a third gate coupled to the second node; a third current source; a fourth FET coupled in series with the third current source between the first voltage rail and the second node, wherein the fourth FET includes a fourth gate coupled to the first node; and a third capacitor coupled between a third node between the second current source and the third FET, and a fourth node between the third current source and the fourth FET.

Aspect 15: The apparatus of aspect 14, wherein the third capacitor includes a variable capacitor.

Aspect 16: The apparatus of aspect 14 or 15, wherein the second and third current sources include variable current sources, respectively.

Aspect 17: The apparatus of any one of aspects 1-16, further including switching devices coupled between the differential data outputs of the application processor and the USB differential data transmission lines, respectively.

Aspect 18: The apparatus of any one of aspects 1-17, wherein the audio circuit includes stereo amplifiers.

Aspect 19: The apparatus of any one of aspects 1-18, further including: a battery charger including data ports; and a third pair of switching devices coupled between the data ports of the battery charger circuit and the USB differential data transmission lines, respectively.

Aspect 20: The apparatus of any one of aspects 1-19, further including an overvoltage protection (OVP) circuit coupled to the USB differential data transmission lines.

Aspect 21: A method, including: receiving a Universal Serial Bus (USB) differential data signal to USB differential data transmission lines; equalizing the USB differential data signal; and routing the equalized USB differential data signal between an application processor and a USB host connector.

Aspect 22: The method of aspect 21, wherein equalizing the USB differential data signal includes applying negative capacitance to the USB differential transmission lines.

Aspect 23: The method of aspect 21 or 22, wherein equalizing the USB differential data signal includes applying negative resistance to the USB differential transmission lines.

Aspect 24: The method of any one of aspects 21-23, further including providing stereo audio signals to the USB differential transmission lines, respectively.

Aspect 25: An apparatus, including: means for receiving a Universal Serial Bus (USB) differential data signal to USB differential data transmission lines; means for equalizing the USB differential data signal; and means for routing the equalized USB differential data signal between an application processor and a USB host connector.

Aspect 26: The apparatus of aspect 25, wherein the means for equalizing the USB differential data signal includes means for applying negative capacitance to the USB differential transmission lines.

Aspect 27: The apparatus of aspect 25 or 26, wherein the means for equalizing the USB differential data signal includes means for applying negative resistance to the USB differential transmission lines.

Aspect 28: The apparatus of any one of aspects 25-27, further including means for providing stereo audio signals to the USB differential transmission lines, respectively.

Aspect 29: A wireless communication device, including: at least one antenna; a transceiver coupled to the at least one antenna; one or more signal processing cores coupled to the transceiver; a Universal Serial Bus (USB) host data transmission circuit coupled to the one or more signal processing cores, wherein the USB host data transmission circuit includes: USB differential data transmission lines; a USB host connector coupled to the USB differential data transmission lines; an application processor including differential data outputs selectively coupled to the USB differential data transmission line, respectively; and an equalizer including differential terminals coupled to the USB differential data transmission lines, respectively.

Aspect 30: The wireless communication device of aspect 29, further including an audio circuit including stereo outputs selectively coupled to the USB differential data transmission lines, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
   a first pair of switching devices configured to selectively couple an application processor to Universal Serial Bus (USB) differential data transmission lines;
   a second pair of switching devices configured to selectively couple an audio circuit to the USB differential data transmission lines; and
   an equalizer including differential terminals coupled to the USB differential data transmission lines, respectively, wherein the equalizer comprises:
   a first current source;
   a first field effect transistor (FET) coupled in series with the first current source between a first voltage rail and a negative one of the USB differential data transmission lines, wherein the first FET includes a first gate coupled to a positive one of the USB differential data transmission lines;
   a second current source;
   a second FET coupled in series with the second current source between the first voltage rail and the positive one of the USB differential data transmission lines, wherein the second FET includes a second gate coupled to the negative one of the USB differential data transmission lines; and
   a capacitor coupled between a first node between the first current source and the first FET, and a second node between the second current source and the second FET.

2. The apparatus of claim 1, wherein the capacitor comprises a variable capacitor.

3. The apparatus of claim 1, wherein the equalizer further comprises a resistor coupled between the first and second nodes.

4. The apparatus of claim 3, wherein the resistor comprises a variable resistor.

5. The apparatus of claim 1, wherein the first and second current sources comprise first and second variable current sources, respectively.

6. The apparatus of claim 1, wherein the first and second FETs comprise p-channel metal oxide semiconductor (PMOS) FETs, respectively.

7. An apparatus, comprising:
   a first pair of switching devices configured to selectively couple an application processor to Universal Serial Bus (USB) differential data transmission lines;
   a second pair of switching devices configured to selectively couple an audio circuit to the USB differential data transmission lines; and
   an equalizer including differential terminals coupled to the USB differential data transmission lines, respectively, wherein the equalizer comprises:
   a first resistor;
   a first field effect transistor (FET);
   a first current source coupled in series with the first resistor and the first FET between a first voltage rail and a second voltage rail;
   a second resistor;
   a second FET coupled in series with the second resistor and the first current source between the first and second voltage rails;

a first capacitor coupled between a first node between the first resistor and the first FET, and a positive one of the USB differential data transmission lines; and a second capacitor coupled between a second node between the second resistor and the second FET, and a negative one of the USB differential data transmission lines.

8. The apparatus of claim 7, wherein the equalizer further comprises:

a third capacitor coupled between the negative one of the USB differential data transmission lines and a first gate of the first FET; and a fourth capacitor coupled between the positive one of the USB differential data transmission lines and a second gate of the second FET.

9. The apparatus of claim 7, wherein the equalizer further comprises:

a gate bias voltage source;

a third resistor coupled between the gate bias voltage source and a first gate of the first FET; and a fourth resistor coupled between the gate bias voltage source and a second gate of the second FET.

10. The apparatus of claim 7, wherein the first and second capacitors comprise first and second variable capacitors, respectively.

11. The apparatus of claim 7, wherein the first current source comprises a variable current source.

12. The apparatus of claim 7, wherein the first and second FETs comprise n-channel metal oxide semiconductor (NMOS) FETs, respectively.

13. The apparatus of claim 7, wherein the equalizer further comprises:

a second current source;

a third FET coupled in series with the second current source between the first or a third voltage rail and the first node, wherein the third FET includes a third gate coupled to the second node;

a third current source;

a fourth FET coupled in series with the third current source between the first or the third voltage rail and the second node, wherein the fourth FET includes a fourth gate coupled to the first node; and a third capacitor coupled between a third node between the second current source and the third FET, and a fourth node between the third current source and the fourth FET.

14. The apparatus of claim 13, wherein the third capacitor comprises a variable capacitor.

15. The apparatus of claim 13, wherein the second and third current sources comprise variable current sources, respectively.

16. The apparatus of claim 1, wherein the first pair of switching devices are coupled between differential data outputs of the application processor and the USB differential data transmission lines, respectively.

17. The apparatus of claim 1, wherein the audio circuit comprises stereo amplifiers.

18. The apparatus of claim 1, further comprising:

a battery charger circuit including data ports; and a third pair of switching devices coupled between the data ports of the battery charger circuit and the USB differential data transmission lines, respectively.

19. The apparatus of claim 1, further comprising an overvoltage protection (OVP) circuit coupled to the USB differential data transmission lines.

20. A wireless communication device, comprising:

at least one antenna;

a transceiver coupled to the at least one antenna;

one or more signal processing cores coupled to the transceiver;

a Universal Serial Bus (USB) data switch coupled to the one or more signal processing cores, wherein the USB data switch comprises:

a first pair of switching devices configured to selectively couple an application processor to USB differential data transmission lines;

a second pair of switching devices configured to selectively couple an audio circuit to the USB differential data transmission lines; and an equalizer including differential terminals coupled to the USB differential data transmission lines, respectively, wherein the equalizer comprises:

a first current source;

a first field effect transistor (FET) coupled in series with the first current source between a first voltage rail and a negative one of the USB differential data transmission lines, wherein the first FET includes a first gate coupled to a positive one of the USB differential data transmission lines;

a second current source;

a second FET coupled in series with the second current source between the first voltage rail and the positive one of the USB differential data transmission lines, wherein the second FET includes a second gate coupled to the negative one of the USB differential data transmission lines; and a capacitor coupled between a first node between the first current source and the first FET, and a second node between the second current source and the second FET.

21. The wireless communication device of claim 20, further comprising a third pair of switching devices configured to selectively couple a battery charger circuit to the USB differential data transmission lines, respectively.

* * * * *